US012804871B2

(12) United States Patent
Tanaka et al.

(10) Patent No.: US 12,804,871 B2
(45) Date of Patent: Nov. 17, 2026

(54) FEEDER AND COMPONENT MOUNTING APPARATUS

(71) Applicant: FUJI CORPORATION, Chiryu (JP)

(72) Inventors: Keita Tanaka, Takahama (JP); Norio Hosoi, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 369 days.

(21) Appl. No.: 18/554,302

(22) PCT Filed: Apr. 13, 2021

(86) PCT No.: PCT/JP2021/015307
§ 371 (c)(1),
(2) Date: Oct. 6, 2023

(87) PCT Pub. No.: WO2022/219715
PCT Pub. Date: Oct. 20, 2022

(65) Prior Publication Data
US 2024/0196583 A1 Jun. 13, 2024

(51) Int. Cl.
*H05K 13/04* (2006.01)

(52) U.S. Cl.
CPC ................................ *H05K 13/0419* (2018.08)

(58) Field of Classification Search
CPC .................................................. H05K 13/0419
USPC ..................................................... 414/416.01
See application file for complete search history.

(56) References Cited

U.S. PATENT DOCUMENTS

| | | | | |
|---|---|---|---|---|
| 6,474,527 B2 * | 11/2002 | Miller | B65H 20/22 | 226/139 |
| 7,243,828 B2 * | 7/2007 | Ricketson | B65H 20/22 | 226/57 |
| 9,137,936 B2 * | 9/2015 | Katsumi | H05K 13/0419 | |
| 2002/0108984 A1 * | 8/2002 | Miller | B65H 20/22 | 226/32 |
| 2024/0188270 A1 * | 6/2024 | Tanaka | H05K 13/0419 | |

FOREIGN PATENT DOCUMENTS

| | | | | |
|---|---|---|---|---|
| JP | 2010-103439 A | 5/2010 | | |
| JP | 2012-248784 A | 12/2012 | | |
| JP | 2013-149776 A | 8/2013 | | |
| JP | 2013-229628 A | 11/2013 | | |
| WO | WO 2011/077880 A1 | 6/2011 | | |
| WO | WO-2022219715 A1 * | 10/2022 | | H05K 13/0419 |

OTHER PUBLICATIONS

International Search Report Issued Jul. 6, 2021, in PCT/JP2021/015307, filed on Apr. 13, 2021, 2 pages.

* cited by examiner

*Primary Examiner* — Steven S Paik
(74) *Attorney, Agent, or Firm* — Oblon, McClelland, Maier & Neustadt, L.L.P.

(57) ABSTRACT

A feeder of the present disclosure includes a feeder main body configured to feed a tape in which a component is accommodated to a predetermined position, and a reel holder attached to an upstream side of the feeder main body in a feeding direction of the tape and configured to hold a reel on which the tape is wound, in which the reel holder includes a holder main body configured to hold the reel, a slider that is integrated with the holder main body, and a tape pressing member that is integrated with the slider and is capable of pressing the tape fed from the reel toward the feeder main body from an upper side.

14 Claims, 11 Drawing Sheets

FEEDER AND COMPONENT MOUNTING APPARATUS

TECHNICAL FIELD

The present disclosure relates to a feeder and a component mounting apparatus.

BACKGROUND ART

Conventionally, there has been known a feeder including a tape reel on which a tape in which components are accommodated at predetermined intervals is wound, a holder main body for holding the tape reel, and a feeder main body for feeding the tape, and supplying the components to a component mounting apparatus. For example, Patent Literature 1 discloses a configuration in which multiple holder main bodies 181 are disposed at predetermined intervals at upper position P1 and multiple holder main bodies 181 are disposed at predetermined intervals at lower position P2, as illustrated in FIG. 12 of the present application.

PATENT LITERATURE

Patent Literature 1: JP-A-2013-229628

BRIEF SUMMARY

Technical Problem

Incidentally, in a case where a component is supplied to the component mounting apparatus using such a feeder, as illustrated in FIG. 12, tape 142 fed from reel 141 held by the reel holder disposed at lower position P2 passes between holder main bodies 181 disposed at upper position P1 and reaches feeder main body 143. Therefore, the interval between holder main bodies 181 disposed at upper position P1 has to be set to be equal to or larger than a width of tape 142, and it is difficult to set a large number of feeders 140 on a feeder setting base.

The present disclosure has been made to solve the problems described above, and it is a main object of the present disclosure to set a large number of feeders on a feeder setting base.

Solution to Problem

A feeder of the present disclosure includes:

a feeder main body configured to feed a tape in which a component is accommodated to a predetermined position; and a reel holder attached to an upstream side of the feeder main body in a feeding direction of the tape and configured to hold a reel on which the tape is wound, in which the reel holder includes a holder main body configured to hold the reel, a slider that is integrated with the holder main body, and a tape pressing member that is integrated with the slider and is capable of pressing the tape fed from the reel toward the feeder main body from an upper side.

With this feeder, a large number of feeders can be set on the feeder setting base.

DESCRIPTION OF EMBODIMENTS

Figure 1:
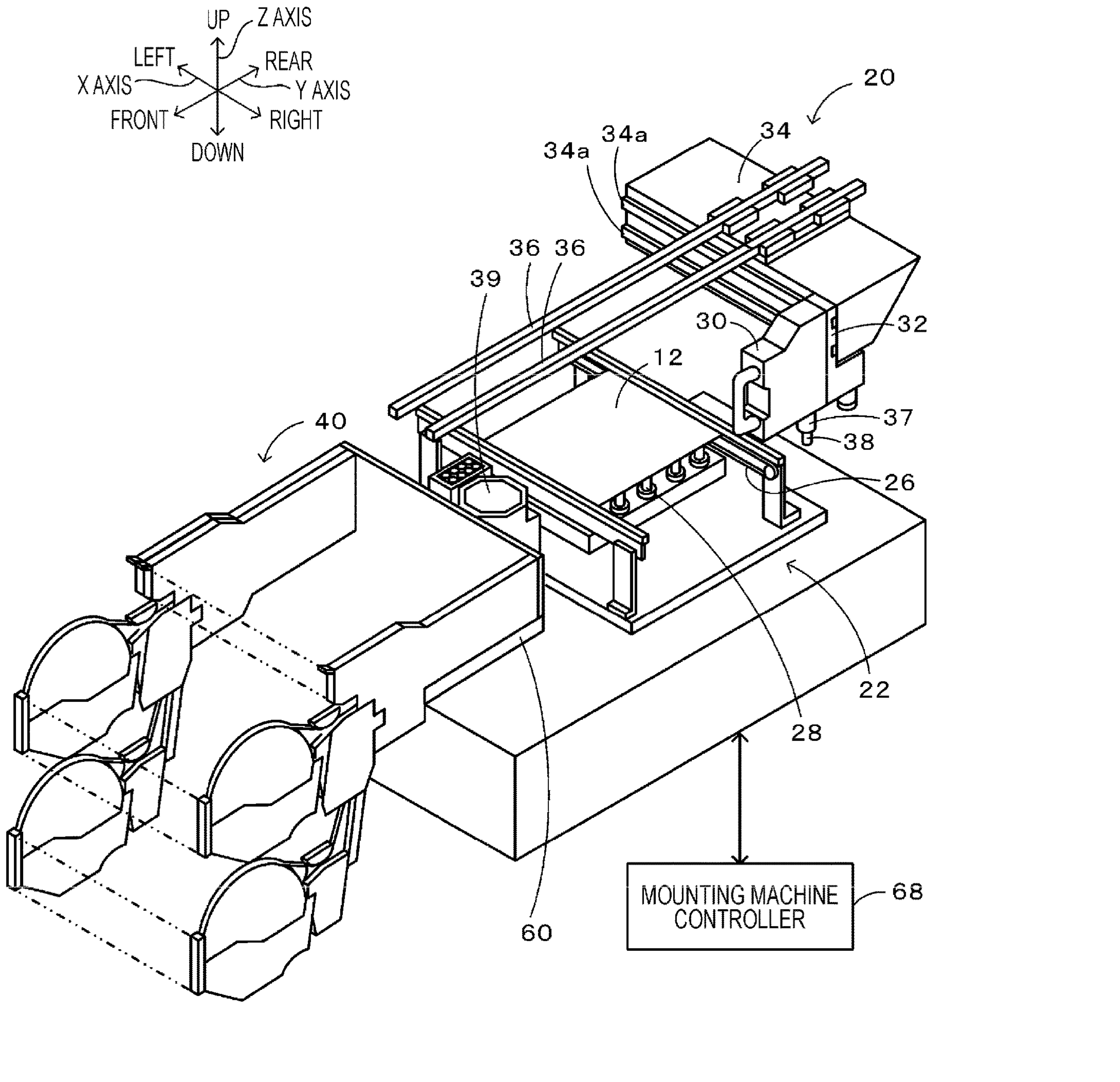
FIG. 1 is a schematic explanatory view of component mounting apparatus 20.
Figure 2:
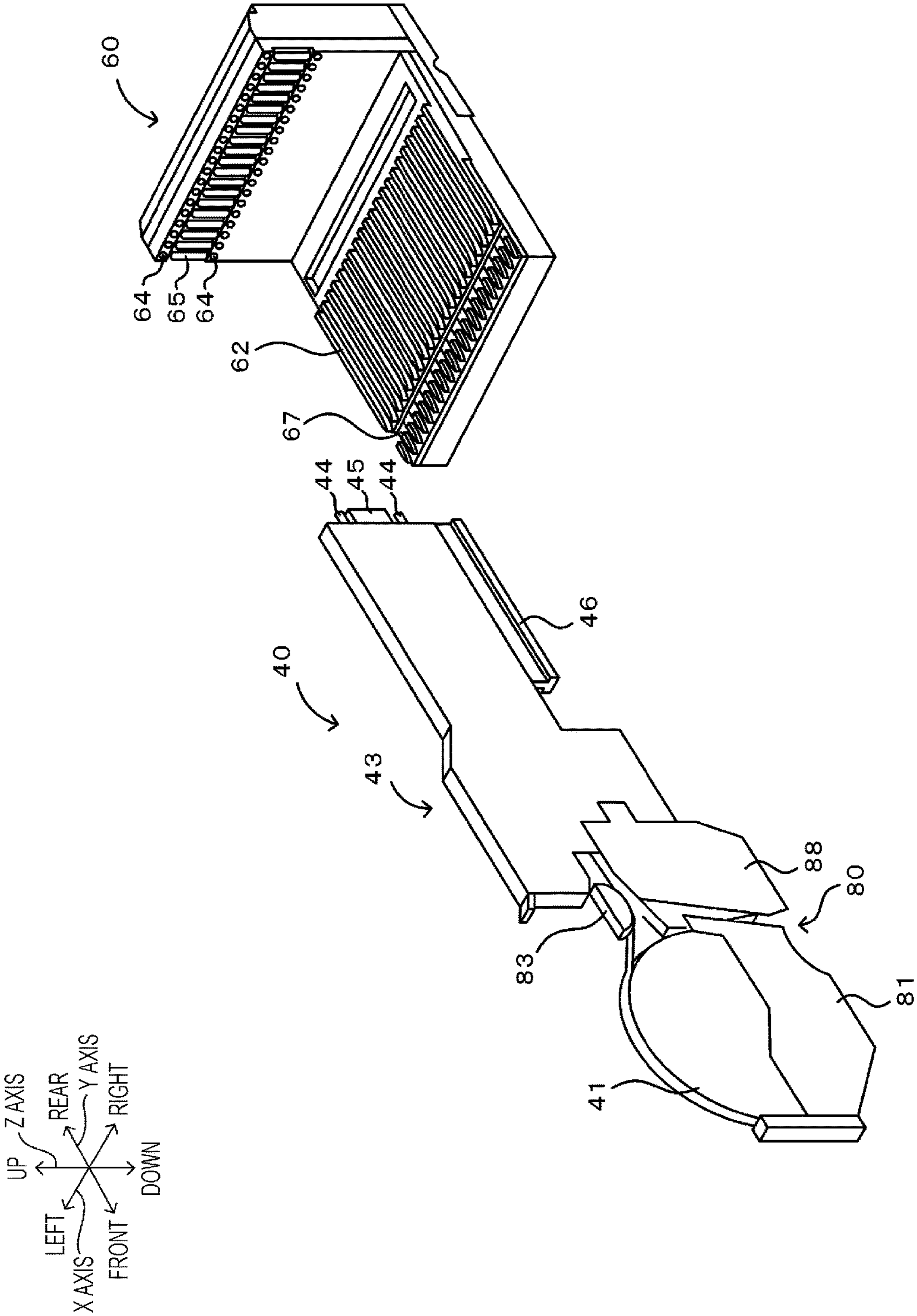
FIG. 2 is a perspective view illustrating a state in which feeder 40 is set on feeder setting base 60.
Figure 3:
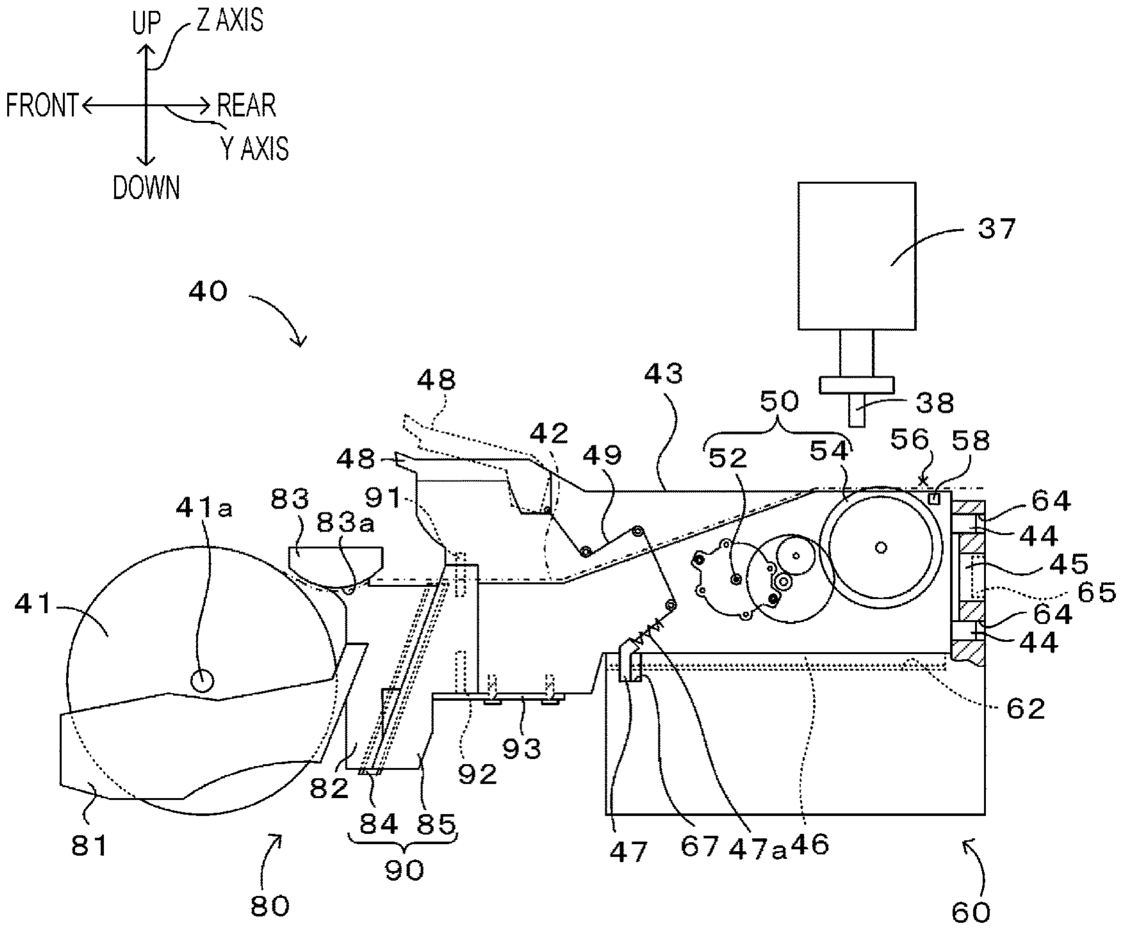
FIG. 3 is a side view schematically illustrating feeder 40 set on feeder setting base 60.
Figure 4:
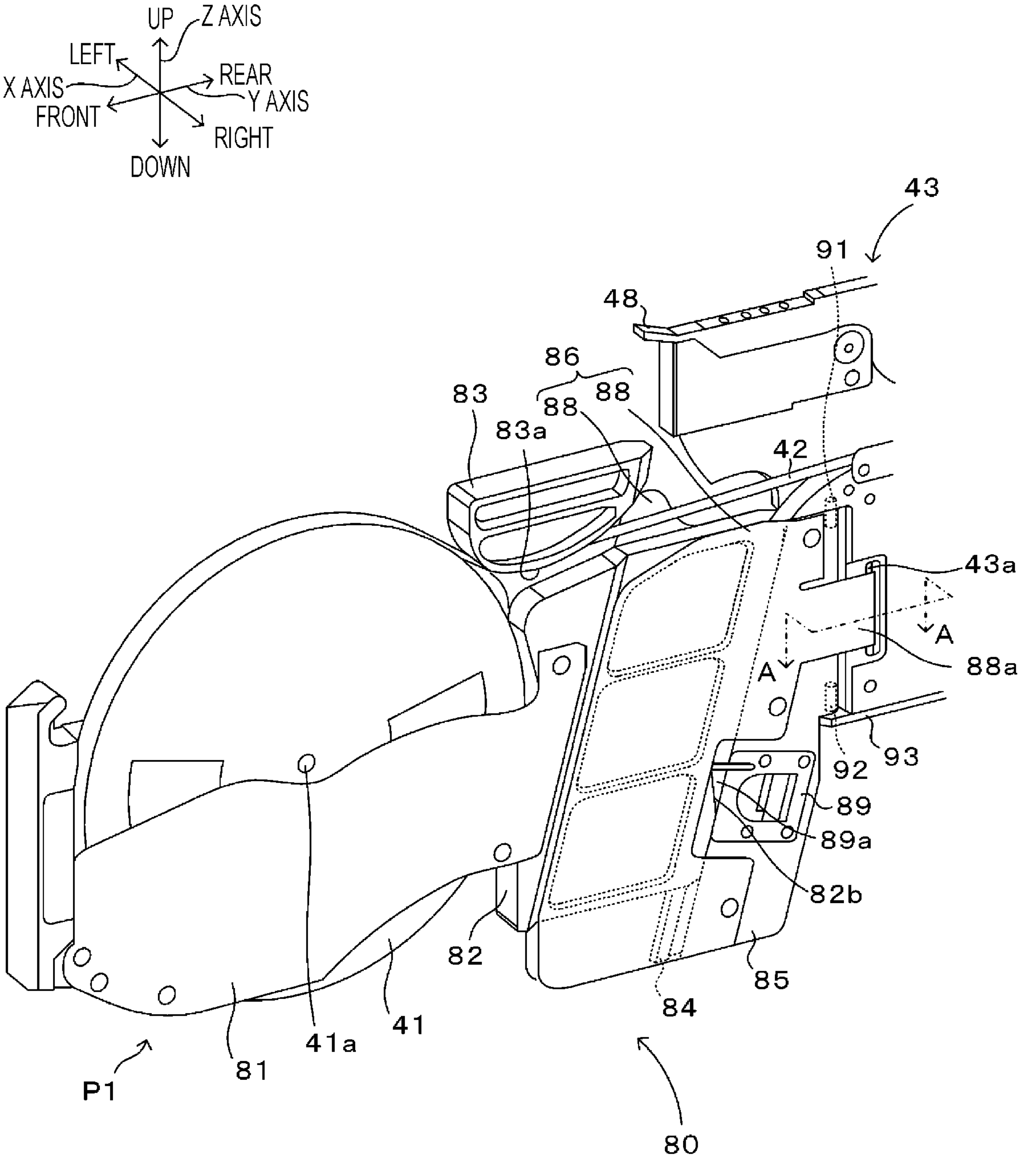
FIG. 4 is a perspective view of reel holder 80 when holder main body 81 is disposed at upper position P1.
Figure 5:
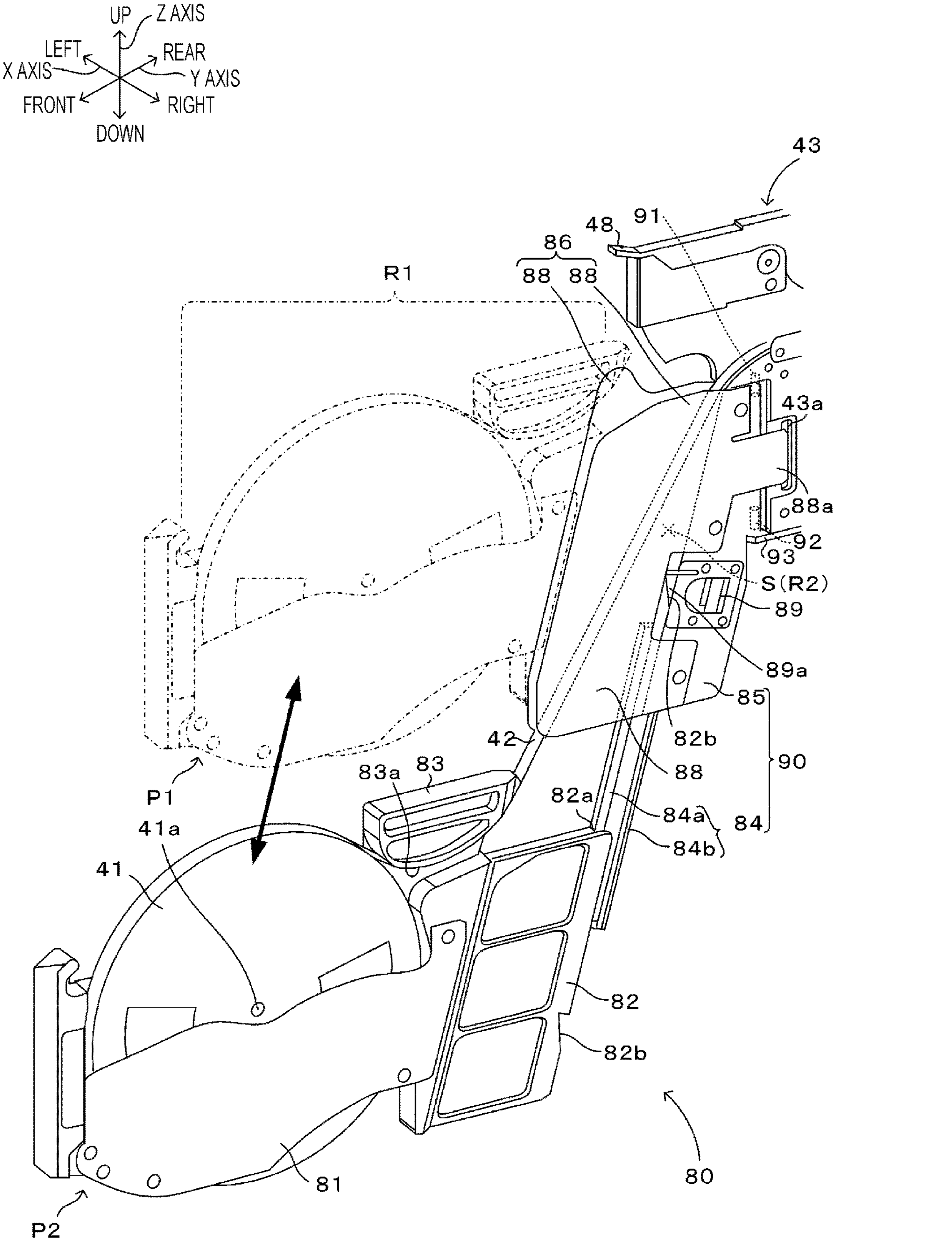
FIG. 5 is a perspective view of reel holder 80 when holder main body 81 is disposed at lower position P2.
Figure 6:
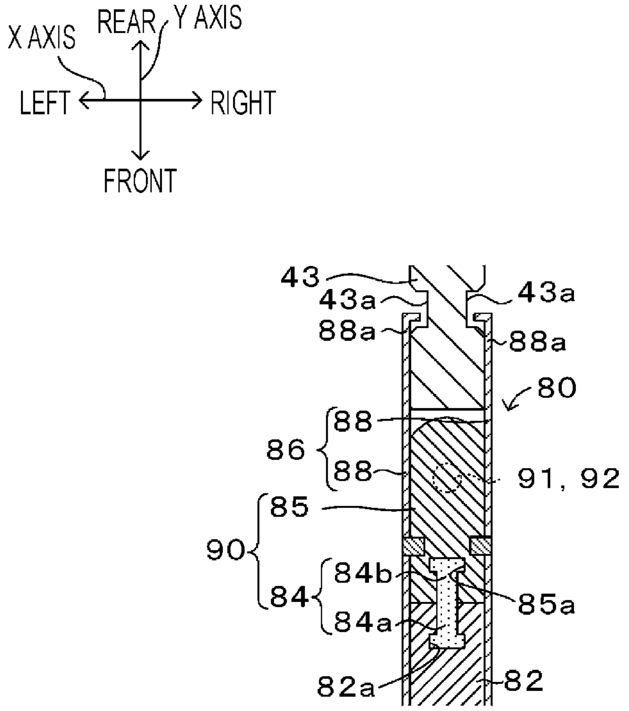
FIG. 6 is a cross-sectional view taken along line A-A in FIG. 4.
Figure 7:
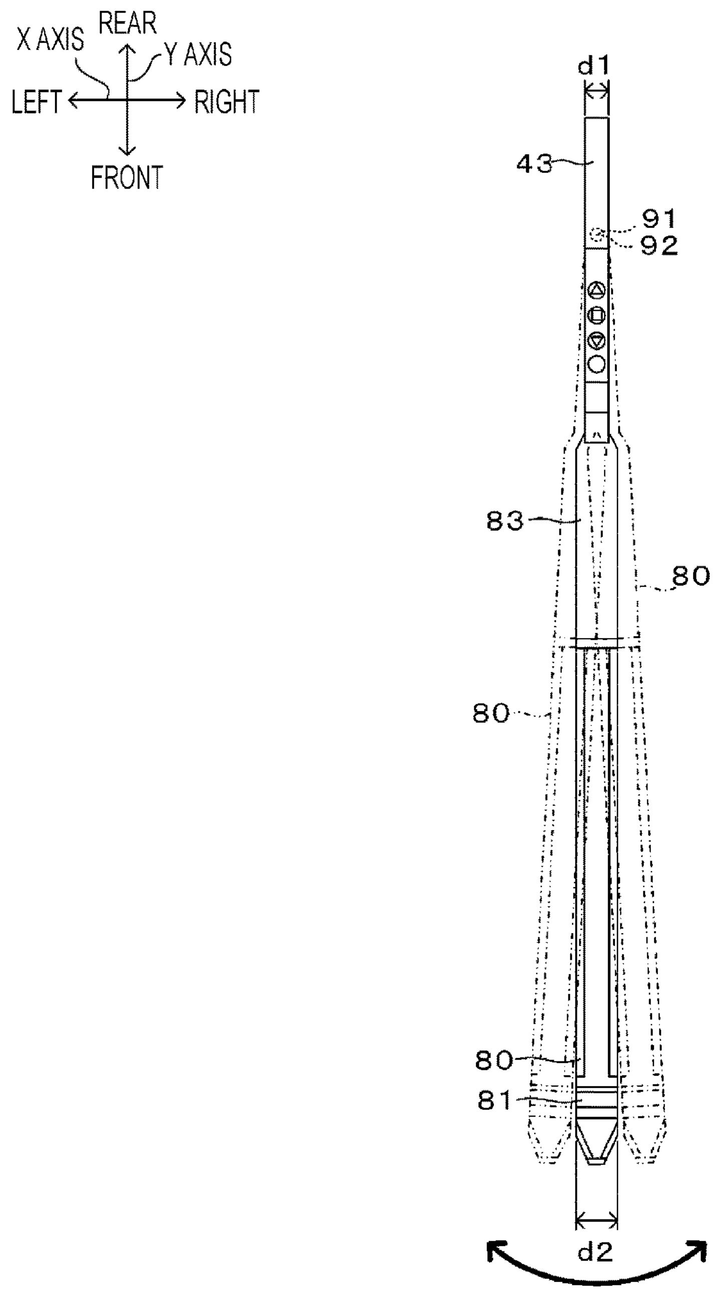
FIG. 7 is an explanatory view illustrating a state in which reel holder 80 swings.
Figure 8:
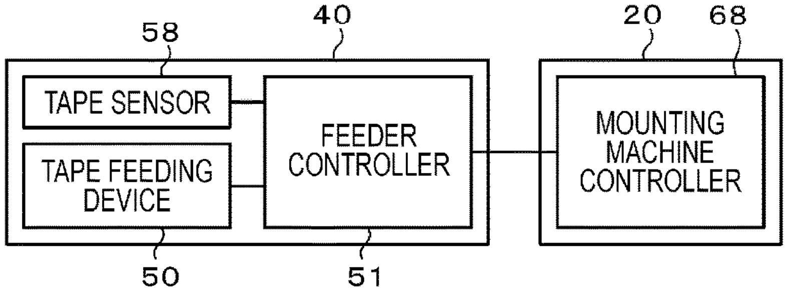
FIG. 8 is a block diagram illustrating electrical connection of component mounting apparatus 20.

Preferred embodiments of the present disclosure will be described below with reference to the accompanying drawings. FIG. 1 is a schematic explanatory view of component mounting apparatus 20, FIG. 2 is a perspective view illustrating a state in which feeder 40 is set on feeder setting base 60, FIG. 3 is a side view schematically illustrating feeder 40 set on feeder setting base 60, FIG. 4 is a perspective view of reel holder 80 when holder main body 81 is disposed at upper position P1, FIG. 5 is a perspective view of reel holder 80 when holder main body 81 is disposed at lower position P2, FIG. 6 is a cross-sectional view taken along line A-A in FIG. 4, FIG. 7 is an explanatory view illustrating a state in which reel holder 80 swings, and FIG. 8 is a block diagram illustrating electrical connection of component mounting apparatus 20. In the present embodiment, a left-right direction (X axis), a front-rear direction (Y axis), and an up-down direction (Z axis) are as illustrated in the respective drawings.

Component mounting apparatus 20 includes board conveyance device 22, head unit 30, part camera 39, feeder 40, feeder setting base 60, and mounting machine controller 68.

Board conveyance device 22 includes a pair of conveyor belts 26 and 26 (only one is illustrated in FIG. 1) that are provided at intervals in the front-rear direction and extend in the left-right direction. Board 12 is placed on upper surfaces of the pair of conveyor belts 26 and 26 and is conveyed from the left to the right. In a case where board 12 reaches a predetermined loading position, board 12 is supported by a number of support pins 28 erected on a rear surface side.

Head unit 30 is detachably attached to a front surface of X-axis slider 32. X-axis slider 32 is slidably attached to a pair of upper and lower guide rails 34*a* and 34*a* extending in the left-right direction and provided on a front surface of Y-axis slider 34. Y-axis slider 34 is slidably attached to a pair of left and right guide rails 36 and 36 extending in the front-rear direction. Head unit 30 moves in the left-right direction as X-axis slider 32 moves in the left-right direction, and moves in the front-rear direction as Y-axis slider 34 moves in the front-rear direction. Each of sliders 32 and 34 is driven by a drive motor which is not illustrated. Head unit 30 has head 37 provided with nozzle 38. Nozzle 38 uses pressure to pick up components to a nozzle tip or to separate components picked up by the nozzle tip. A height of nozzle 38 can be adjusted by a Z-axis ball screw mechanism, which is not illustrated, mounted on head unit 30. Head 37 and nozzle 38 are suitably exchanged depending on the type and size of the components.

Part camera 39 is installed between feeder setting base 60 and board conveyance device 22 so that an imaging direction is directed upward at the approximate center of a length in the left-right direction. Part camera 39 images a component picked up by nozzle 38 passing thereabove and outputs an image obtained by the imaging to mounting machine controller 68.

As illustrated in FIG. 2 and FIG. 3, feeder 40 includes reel 41, reel holder 80, and feeder main body 43. Tape 42 having multiple accommodation recessed portions, which are not illustrated, is wound on reel 41 along a longitudinal direction. Each accommodation recessed portion accommodates a component. These components are protected by a film, which is not illustrated, that covers a surface of tape 42.

Reel holder 80 is a member that holds reel 41 and is attached to an upstream side of feeder main body 43 in a feeding direction (a direction from the front to the rear) of tape 42. As illustrated in FIG. 7, reel holder 80 is swingably attached to feeder main body 43 in a direction of shaft **41*a* of reel 41 (a direction along shaft 41*a* of reel 41). Details of reel holder 80** will be described later.

Feeder main body 43 feeds tape 42 drawn out from reel 41 to predetermined component supply position 56. A pair of upper and lower positioning pins 44 and 44 are provided on a rear end surface of feeder main body 43, and connector 45 is provided between the pair of positioning pins 44 and 44. Rail 46 having an inverted T-shaped cross-sectional shape extending in the front-rear direction is provided on a lower surface of feeder main body 43. Clamp member 47 is provided on the lower surface of feeder main body 43 in front of rail 46. As illustrated in FIG. 3, clamp member 47 is urged by spring **47*a* to protrude downward from the lower surface. Clamp member 47 is connected to clamp lever 48 provided on a front upper surface of feeder main body 43 through wire 49. In a state in which clamp lever 48 is not operated, clamp lever 48 is at a clamping position (refer to a solid line in FIG. 3), and clamp member 47 protrudes from the lower surface. In a case where clamp lever 48 is pivoted to a clamp release position (refer to a dashed line in FIG. 3), clamp member 47 is pulled through wire 49 and is retracted from the lower surface. Tape feeding device 50 transmits the power of servo motor 52 to sprocket 54 through various gears, rotates sprocket 54, and feeds tape 42 engaged with sprocket 54 to the rear side. The film covering the component accommodated in the accommodation recessed portion of tape 42 is peeled off before reaching predetermined component supply position 56. Feeder main body 43 includes a tape sensor 58 in the vicinity of component supply position 56. Tape sensor 58 is a sensor that detects tape 42. Feeder main body 43 incorporates feeder controller 51 (refer to FIG. 8). Feeder controller 51 inputs a detection signal from tape sensor 58 and outputs a control signal to tape feeding device 50**.

As illustrated in FIG. 2 and FIG. 3, feeder setting base 60 has multiple slots 62 on an upper surface thereof. Slot 62 is an inverted T-shaped cross-sectional groove extending in the front-rear direction, and is configured such that rail 46 of feeder 40 is inserted. Clamp groove 67 is provided in slot 62. Feeder setting base 60 has a standing wall at a rear end. On the standing wall, connector 65 is provided at a position corresponding to each slot 62, and positioning holes 64 and 64 are provided above and below connector 65. In a case where rail 46 of feeder 40 is inserted from the front side to the rear side of slot 62, clamp member 47 provided on the lower surface of feeder 40 is fitted into clamp groove 67. As a result, feeder 40 is supported in a vertically disposed state in slot 62, and a position in the front-rear direction is determined by clamp member 47 and clamp groove 67. In addition, positioning pins 44 and 44 of feeder 40 are fitted into positioning holes 64 and 64 of feeder setting base 60, and connector 45 of feeder 40 is electrically connected to connector 65 of feeder setting base 60. As a result, power supply is supplied from component mounting apparatus 20 to feeder 40. In addition, as illustrated in FIG. 8, feeder controller 51 is capable of bidirectional communication with mounting machine controller 68.

As illustrated in FIG. 3 to FIG. 5, reel holder 80 includes holder main body 81, slider 82, tape pressing member 83, movement mechanism 90, and duct 86. In FIG. 3, duct 86 is not illustrated.

Holder main body 81 is a member that rotatably holds reel 41. Reel 41 is rotatably held about shaft **41*a*. A direction of shaft 41*a* coincides with the left-right direction. Holder main body 81 is fixed to slider 82 by screws and is integrated with slider 82. As illustrated in FIG. 7, width d2 of holder main body 81 that holds reel 41 is larger than width d1 of feeder main body 43**.

Slider 82 is a substantially rectangular member that moves holder main body 81 in the up-down direction. Long groove **82*a* in the up-down direction having a T-shaped cross-sectional shape is formed on a rear end surface of slider 82. In addition, recessed portion 82*b* is formed on slider 82**.

Tape pressing member 83 is a substantially semicircular member integrated with slider 82. Tape pressing member 83 has pressing section **83*a* having a substantially arcuate shape. Pressing section 83*a* presses tape 42 fed from reel 41 held by holder main body 81 toward feeder main body 43** from the upper side.

Movement mechanism 90 is a mechanism for supporting slider 82 integrated with holder main body 81 and tape pressing member 83 so as to be movable up and down between upper position P1 (a position indicated by chain lines) and lower position P2 (a position indicated by solid lines) as illustrated in FIG. 5. Holder main body 81 disposed at upper position P1 is referred to as upper holder main body 81, and holder main body 81 disposed at lower position P2 is referred to as lower holder main body 81. Movement mechanism 90 includes guide rail 84 and rail support 85.

Guide rail 84 is a linear rail extending in the up-down direction in a slightly inclined state, and supports slider 82 integrated with holder main body 81 and tape pressing member 83 so as to be movable up and down. As illustrated in FIG. 6, guide rail 84 has a H-shaped cross-sectional shape as a whole and includes front part **84*a* having a T-shaped cross-sectional shape and rear part 84*b* having a T-shaped cross-sectional shape. Front part 84*a* of guide rail 84 is inserted into long groove 82*a* of slider 82. As a result, slider 82 can slide in the up-down direction along guide rail 84**.

Rail support 85 is a plate-shaped member having substantially the same thickness as slider 82, and is supported by feeder main body 43 so as to be immovable up and down. Rail groove **85*a* in the up-down direction having a T-shaped cross-sectional shape is formed on a rear end surface of rail support 85. Rear part 84*b* of guide rail 84 is inserted into rail groove 85*a*. As a result, guide rail 84 is slidable in the up-down direction along rail groove 85*a*. In addition, rail support 85 includes lock member 89 as illustrated in FIG. 4** and FIG. 5. Lock member 89 includes claw section 89*a* having a shape corresponding to recessed portion 82*b*. Claw section 89*a* is urged by a spring, which is not illustrated, toward front slider 82.

As illustrated in FIG. 4 and FIG. 5, duct 86 includes a pair of metal thin plates 88 and 88 provided so as to sandwich rail support 85 from left and right, and is fixed to rail support 85 by screws. Therefore, duct 86 is held at the same height regardless of the movement of slider 82. Space S is formed between the pair of metal thin plates 88 and 88. Slider 82 disposed at upper position P1 is accommodated in space S. When slider 82 is disposed at lower position P2, space S becomes hollow.

Here, rail support 85 will be described in more detail. Rail support 85 is attached to be swingable in the left-right direction (in a direction of shaft 41*a* of reel 41) through upper and lower support shafts 91 and 92 of feeder main body 43. Upper support shaft 91 is screwed to feeder main body 43 and is inserted into an upper surface of rail support 85. Lower support shaft 92 is fixed to an upper surface of tongue-shaped bracket 93 screwed to the front of a lower surface of feeder main body 43, and is inserted into a lower surface of rail support 85. Plate spring section 88*a* having a substantially rectangular shape extending rearward is integrally formed on metal thin plate 88 fixed to rail support 85. A front end of plate spring section 88*a* is integrated with metal thin plate 88 and is fixed to rail support 85. A rear end of plate spring section 88*a* is in contact with feeder main body 43, but is not fixed. In the present embodiment, the rear end of plate spring section 88*a* is bent in an L shape and is hooked in long groove 43*a* in the up-down direction provided in feeder main body 43. Rail support 85 is an element of reel holder 80. Therefore, the configuration that rail support 85 is attached to feeder main body 43 in a swingable manner in the left-right direction results in that reel holder 80 is attached to feeder main body 43 in a swingable manner in the left-right direction.

Mounting machine controller 68 is configured as a microprocessor centered on CPU, and includes ROM for storing various programs, a storage for storing various data, RAM used as a work area, and the like. These are electrically connected through a bus which is not illustrated. In addition, mounting machine controller 68 is connected to board conveyance device 22, X-axis slider 32, Y-axis slider 34, a Z-axis ball screw mechanism, and the like so as to be able to output a control signal to those devices, and is also connected so that images can be input from part camera 39.

Next, an operation of component mounting apparatus 20 will be described. Mounting machine controller 68 of component mounting apparatus 20 controls board conveyance device 22, X-axis slider 32, Y-axis slider 34, the Z-axis ball screw mechanism, part camera 39, and the like based on the production job, and produces board 12 on which multiple components are mounted. Specifically, mounting machine controller 68 causes nozzle 38 to pick up components supplied by respective feeders 40, causes part camera 39 to image the components, performs correction based on the captured image, and then performs control such that the components picked up by nozzle 38 are mounted on board 12 in sequence.

Next, a case where an operator moves holder main body 81 of reel holder 80 between upper position P1 and lower position P2 will be described with reference to FIG. 5. In a case where holder main body 81 is moved from lower position P2 to upper position P1, the operator moves slider 82 integrated with holder main body 81 and tape pressing member 83 upward along guide rail 84 while moving guide rail 84 along rail groove 85*a* of rail support 85 and storing it in rail groove 85*a*. Then, claw section 89*a* of lock member 89 provided on rail support 85 engages with recessed portion 82*b* of slider 82 by the elastic force of the spring, and locks the movement of slider 82. As a result, holder main body 81 is disposed at upper position P1. On the other hand, in a case where holder main body 81 is moved from upper position P1 to lower position P2, the operator removes claw section 89*a* from recessed portion 82*b* by gripping lock member 89, moves slider 82 downward along guide rail 84, and extends guide rail 84 downward from rail groove 85*a* of rail support 85. As a result, holder main body 81 is disposed at lower position P2.

In this way, in a case where holder main body 81, slider 82, and tape pressing member 83 are disposed at lower position P2, tape pressing member 83 presses tape 42 such that tape 42 fed from reel 41 to feeder main body 43 does not pass through holder main body presence region R1, as illustrated in FIG. 5. Holder main body presence region R1 is a region in which holder main body 81 should be present if holder main body 81, slider 82, and tape pressing member 83 are disposed at upper position P1. In a case where holder main body 81, slider 82, and tape pressing member 83 are disposed at lower position P2, tape pressing member 83 presses tape 42 such that tape 42 fed from reel 41 to feeder main body 43 passes through empty space S (slider presence region R2) of duct 86. Slider presence region R2 is a region in which slider 82 should be present if holder main body 81, slider 82, and tape pressing member 83 are disposed at upper position P1.

Figure 12:
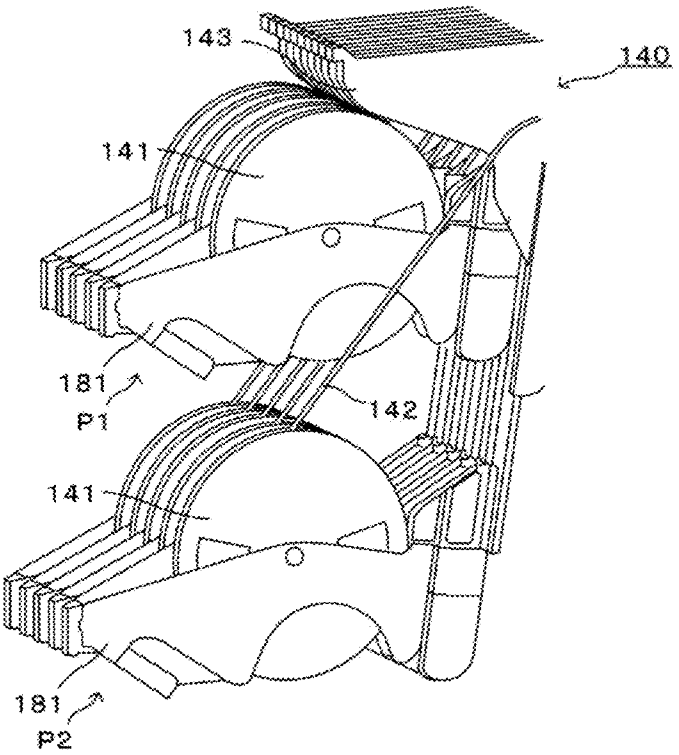
Fig. 12 Prior Art
FIG. 12 is a perspective view illustrating a state in which holder main body 181 of a conventional art is alternately disposed at upper position P1 and lower position P2.

At this time, as illustrated in FIG. 12, in a conventional art in which tape pressing member 83 is not provided, in a case where reel 141 held by holder main body 181 at upper position P1 is pulled upward by tape 142, there is a risk that reel 141 may hit feeder main body 143 and stack. On the other hand, in feeder 40 of the present embodiment, tape pressing member 83 presses tape 42 fed from reel 41 to feeder main body 43 from the upper side. Therefore, it is suppressed that reel 41 is pulled upward by tape 42. Therefore, it is possible to prevent reel 41 from floating.

Figure 9:
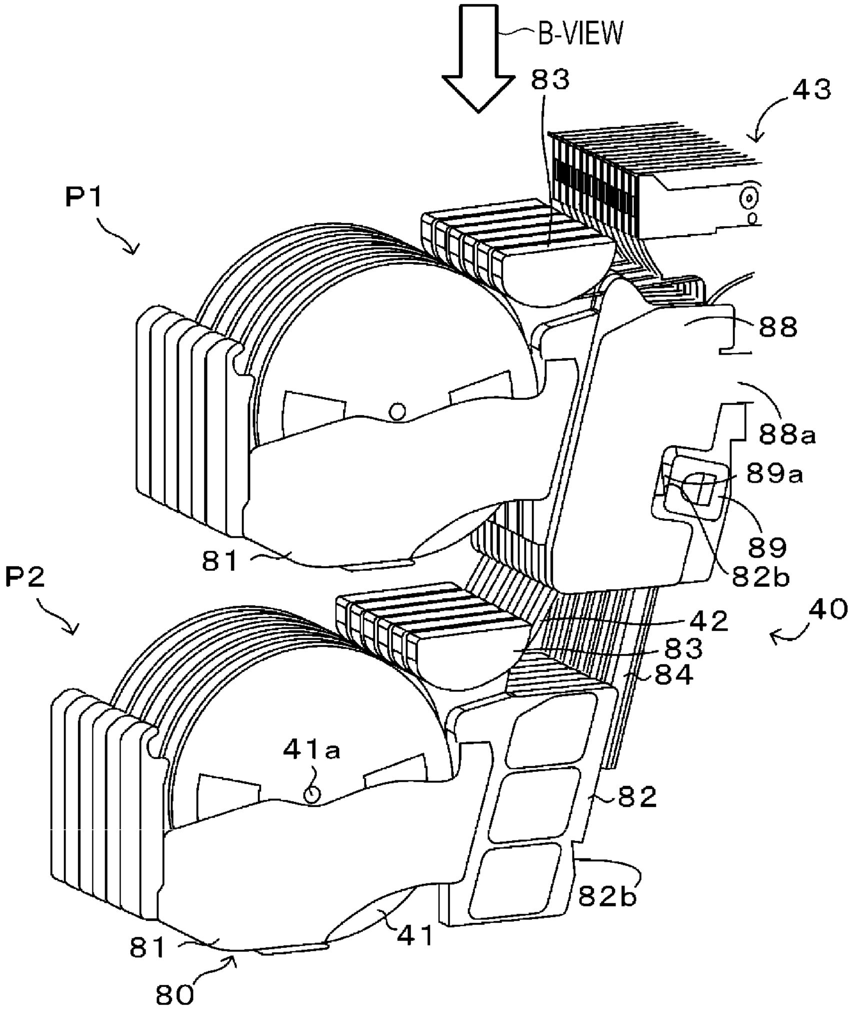
FIG. 9 is a perspective view illustrating a state in which holder main body 81 is alternately disposed at upper position P1 and lower position P2.
Figure 10:
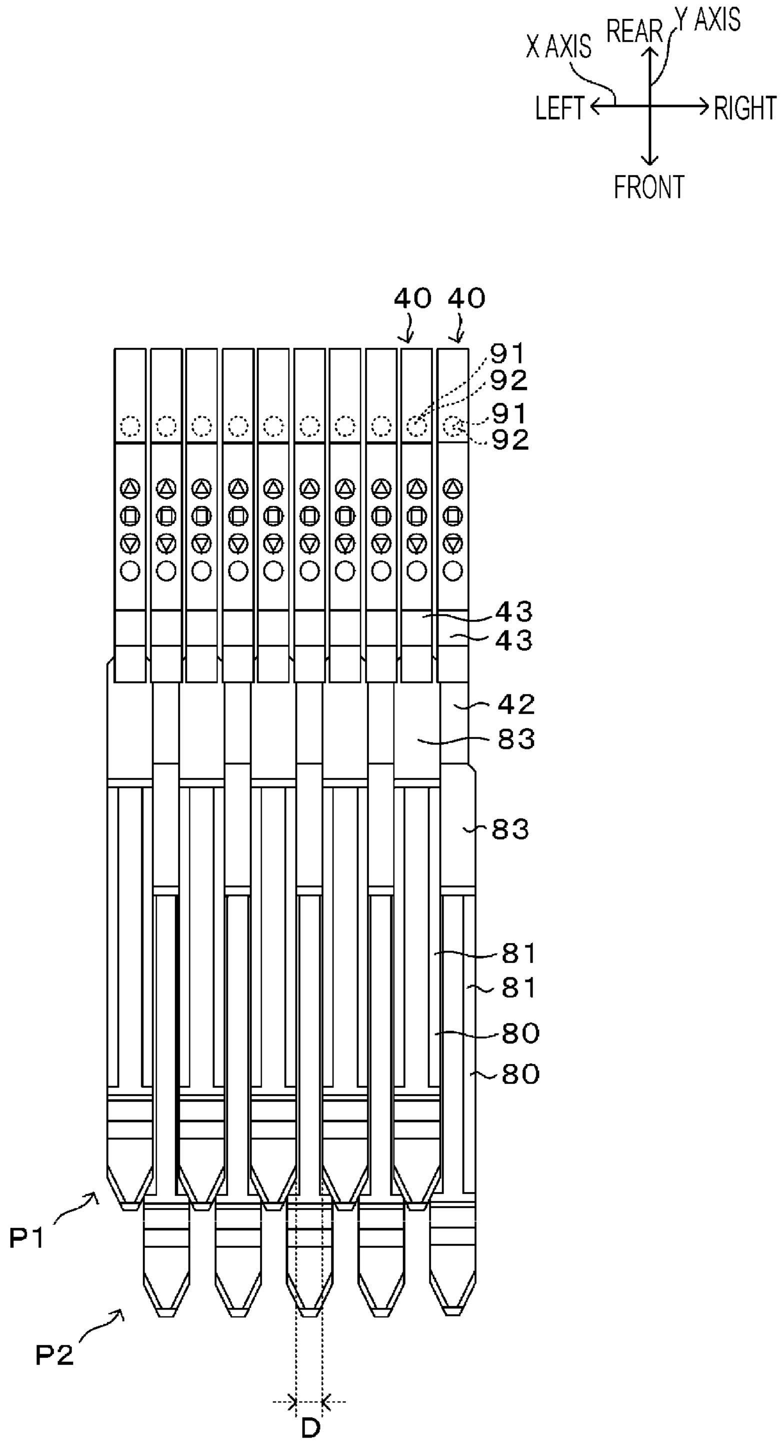
FIG. 10 is a B-view of FIG. 9.

In the conventional art, as illustrated in FIG. 12, feeder 140 is inserted into all slots 62 of feeder setting base 60, and feeder 140 in which holder main body 181 is disposed at upper position P1 and feeder 140 in which holder main body 181 is disposed at lower position P2 are alternately arranged in some cases. In this case, it is necessary to pass tape 142 fed from reel 141 held by holder main body 181 at lower position P2 between holder main bodies 181 at upper position P1. Therefore, it is necessary to set an interval between slots 62 of feeder setting base 60 such that an interval between holder main bodies 181 at upper position P1 is larger than a width of tape 142. On the other hand, also in the present embodiment, feeder 40 is inserted into all slots 62 of feeder setting base 60, and feeder 40 in which holder main body 81 is disposed at upper position P1 and feeder 40 in which holder main body 81 is disposed at lower position P2 are alternately arranged as illustrated in FIG. 9 and FIG. 10 in some cases. In this case, the interval between slots 62 of feeder setting base 60 can be set smaller than in the conventional art such that interval D between holder main bodies 81 held at upper position P1 is equal to or less than the width of tape 42. Therefore, it is possible to set more feeders 40 on feeder setting base 60 than in the conventional art.

Next, an exchange operation performed when it is necessary to exchange one feeder 40 (referred to as extraction target of feeder 40) with another feeder 40 (referred to as insertion target of feeder 40) for any reason will be described. Here, it is assumed that feeder 40 is inserted in all slots 62 of feeder setting base 60. In addition, before the exchange operation is performed, reel holder 80 is maintained in the basic position illustrated in FIG. 11B. In the basic position, reel holder 80 assumes a posture aligned in a straight line with feeder main body 43 in the front-rear direction.

First, the operator pivots clamp lever 48 of extraction target of feeder 40 to the clamp release position, releases the clamp, pulls feeder 40 to the front side, and extracts it from feeder setting base 60. In this way, one slot 62 among slots 62 of feeder setting base 60 becomes empty slot 62.

Next, the operator inserts insertion target of feeder 40 into empty slot 62, pivots clamp lever 48 of feeder 40 to the clamping position, and clamps feeder 40. The position of holder main body 81 of insertion target of feeder 40 is aligned with the position of holder main body 81 of extraction target of feeder 40 before feeder 40 is inserted into empty slot 62.

Figure 11A:
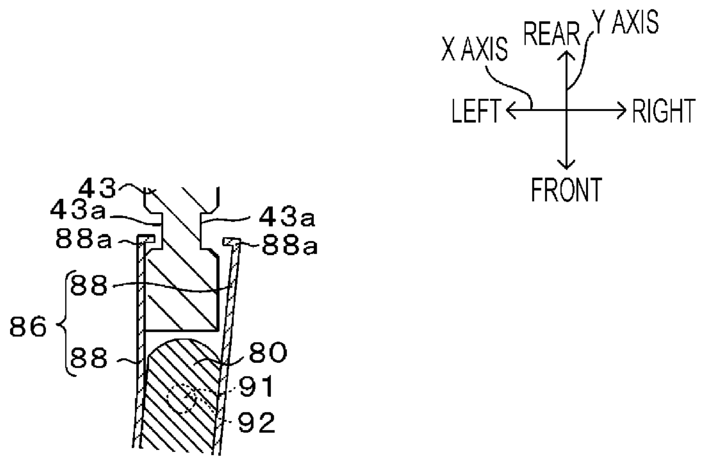
FIG. 11 is a cross-sectional view illustrating a state in which reel holder 80 swings.
Figure 11B:
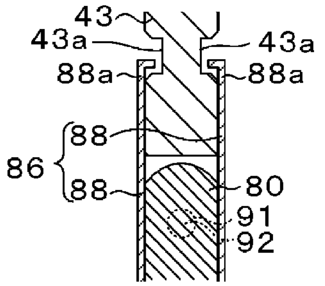
Figure 11C:
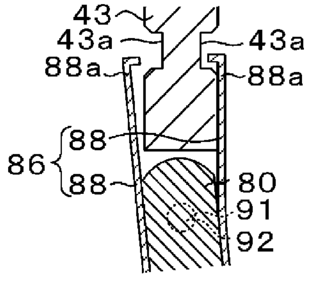

In a case where extraction target of feeder 40 is extracted from feeder setting base 60 or insertion target of feeder 40 is set in feeder setting base 60, reel holder 80 of extraction target of feeder 40 or feeder 40 set near empty slot 62 may be pushed in the left-right direction to widen them. Specifically, the operator may push such reel holder 80 to the left side against the elastic force of plate spring section 88*a* as illustrated in FIG. 11A, or may push reel holder 80 to the right side against the elastic force of plate spring section 88*a* as illustrated in FIG. 11C. Since reel holder 80 is swingably attached to feeder main body 43, no trouble occurs even if reel holder 80 is pushed in the left-right direction in this manner.

At this time, as in the conventional art illustrated in FIG. 12, if tape 142 fed from reel 141 held by holder main body 181 on the lower side passes between holder main bodies 181 on the upper side, it is necessary to push holder main body 181 left and right and brush aside tape 142 at the same time. On the other hand, as in the present embodiment illustrated in FIG. 9, in a case where feeder 40 is set on feeder setting base 60, tape 42 fed from reel 41 held by holder main body 81 on the lower side passes through slider presence region R2 (space S between metal thin plates 88 and 88) without passing through holder main body presence region R1. Therefore, when extraction target of feeder 40 is extracted from feeder setting base 60, or insertion target of feeder 40 is inserted into slot 62 of feeder setting base 60, it is unnecessary to brush aside tape 42.

According to feeder 40 described above, tape 42 fed from reel 41 toward feeder main body 43 is pressed from the upper side by tape pressing member 83. Tape pressing member 83 suppresses reel 41 from being pulled upward by tape 42. Therefore, it is possible to prevent reel 41 from floating.

In addition, reel holder 80 includes movement mechanism 90 that movably supports holder main body 81, slider 82, and tape pressing member 83 between upper position P1 and lower position P2. Then, in a case where holder main body 81 is disposed at lower position P2, tape 42 is pressed so that tape 42 fed from reel 41 to feeder main body 43 does not pass through holder main body presence region R1. Therefore, in a case where multiple feeders 40 are set side by side on feeder setting base 60 in a predetermined direction and holder main body 81 is alternately disposed at upper position P1 and lower position P2, tape 42 directed from reel 41 held by holder main body 81 disposed at lower position P2 to feeder main body 43 does not pass between holder main bodies 81 disposed at upper position P1. Therefore, it is unnecessary to set the interval between holder main bodies 81 on the upper side to be larger than the width of tape 42. Therefore, it is possible to set more feeders 40 on feeder setting base 60 than in the conventional art.

Further, in a case where holder main body 81 is disposed at lower position P2, tape pressing member 83 presses tape 42 such that tape 42 fed from reel 41 to feeder main body 43 passes through slider presence region R2. Therefore, the length of tape 42 in a part from reel 41 held by holder main body 81 on the lower side to feeder main body 43 is relatively short. Therefore, the efficiency is improved in comparison with a case where the length of tape 42 in this part is long.

Furthermore, reel holder 80 has duct 86. Duct 86 is held at the same height regardless of the movement of holder main body 81, and in a case where holder main body 81 is disposed at lower position P2, tape 42 fed from reel 41 held by holder main body 81 toward feeder main body 43 passes through the inside of duct 86. Therefore, tape 42 directed from reel 41 held by holder main body 81 on the lower side toward feeder main body 43 is protected by duct 86. Therefore, it is possible to prevent the lateral deviation.

Reel holder 80 is swingably attached to feeder main body 43 in the direction of shaft 41*a* of reel 41. Therefore, when an attempt is made to set new feeder 40 on feeder setting base 60 in a state in which multiple feeders 40 are set on feeder setting base 60, reel holder 80 swings in the axial direction of reel 41 with respect to feeder main body 43 even if the adjacent reel holders 80 are excessively pushed and widened in the direction of shaft 41*a* of reel 41. Therefore, it is possible to prevent reel holder 80 and feeder main body 43 from being damaged. In addition, reel holder 80 is attached to feeder main body 43 through upper and lower support shafts 91 and 92 and has plate spring section 88*a* that sandwiches the feeder main body from both sides in the direction of shaft 41*a* of reel 41 of reel holder 80. Therefore, reel holder 80 is supported by upper and lower support shafts 91 and 92. Therefore, in a state in which external force is not applied, plate spring sections 88*a* and 88*a* are constantly supported in the same posture (basic position). Therefore, it is easy to perform the operation.

In addition, feeder 40 is provided in component mounting apparatus 20. Therefore, reel 41 is prevented from floating during component mounting. Therefore, a failure is less likely to occur during component mounting.

The present disclosure is not limited in any way to the embodiments described above, and it is needless to say that the present disclosure can be implemented in various forms as long as they belong to the technical scope of the present disclosure.

For example, in the embodiment described above, tape pressing member 83 is a substantially semicircular member, but is not limited to this. The shape of tape pressing member 83 is not particularly limited as long as it can press tape 42 from the upper side, and it may be, for example, a member having a substantially circular shape, or a member having a semicircular shape or a circular shape may be provided on the lower side of a rod-shaped member. However, it is preferable that the shape has a large contact area with tape 42, for example, a substantially semicircular shape or a substantially circular shape. In addition, in consideration of the compactness of reel holder 80, it is more preferable that the shape of tape pressing member 83 is a substantially semicircular shape.

In the embodiment described above, reel holder 80 is swingably attached to feeder main body 43 in the direction of shaft 41$a$ of reel 41 (the left-right direction), but it is not limited to this. For example, reel holder 80 may be fixed to feeder main body 43 so as not to be swingable in the direction of shaft 41$a$ of reel 41.

In the embodiment described above, duct 86 is provided in reel holder 80, but it is not limited to this. For example, duct 86 need not be provided in the reel holder. In this case, the pair of left and right metal thin plates 88 and 88 in duct 86 need not be provided, but only plate spring sections 88$a$ and 88$a$ may be provided.

In the embodiment described above, plate spring section 88$a$ is integrally formed on metal thin plate 88, but it is not limited to this. For example, plate spring section 88$a$ need not be formed on metal thin plate 88.

In the embodiment described above, metal thin plate 88 is provided on both side surfaces of rail support 85, but it is not limited to this. For example, metal thin plate 88 may be provided on only one of the left side surface and the right side surface of rail support 85. In this case, metal thin plate 88 may be screwed to a side surface of rail support 85, and plate spring section 88$a$ may be screwed to a side surface of feeder main body 43. In addition, in this case, upper support shaft 91 and lower support shaft 92 need not be provided.

In the embodiment described above, nozzle 38 is adopted as the pickup member for picking up the component, but it is not limited to this. For example, a mechanical chuck or a robot hand that grips or releases the component by opening and closing multiple claw sections may be adopted as the pickup member.

INDUSTRIAL APPLICABILITY

The present disclosure can be applied to various industries in which an operation of mounting components supplied from a feeder on a board is performed.

REFERENCE SIGNS LIST

12: board, 20: component mounting apparatus, 22: board conveyance device, 26: conveyor belt, 28: support pin, 30: head unit, 32: X-axis slider, 34: Y-axis slider, 34$a$: guide rail, 36: guide rail, 37: head, 38: nozzle, 39: part camera, 40: feeder, 41: reel, 41$a$: shaft, 42: tape, 43: feeder main body, 43$a$: long groove, 44: positioning pin, 45: connector, 46: rail, 47: clamp member, 47$a$: spring, 48: clamp lever, 49: wire, 50: tape feeding device, 51 feeder controller, 52: servo motor, 54: sprocket, 56: component supply position, 58: tape sensor, 60: feeder setting base, 62: slot, 64: positioning hole, 65: connector, 67: clamp groove, 68: mounting machine controller, 80: reel holder, 81: holder main body, 82: slider, 82$a$: long groove, 82$b$: recessed portion, 83: tape pressing member, 83$a$: pressing section, 84: guide rail, 84$a$: front part, 84$b$: rear part, 85: rail support, 85$a$: rail groove, 86: duct, 88: metal thin plate, 88$a$: plate spring section, 89: lock member, 89$a$: claw section, 90: movement mechanism, 91: upper support shaft, 92: lower support shaft, 93: bracket, 140: feeder, 141: reel, 142: tape, 143: feeder main body, D: interval, d1, d2: width, 181: holder main body, P1: upper position, P2: lower position, R1: holder main body presence region, R2: slider presence region, S: space

The invention claimed is:

1. A feeder comprising: a feeder main body configured to feed a tape in which a component is accommodated to a predetermined position; and a reel holder attached to an upstream side of the feeder main body in a feeding direction of the tape and configured to hold a reel on which the tape is wound, wherein the reel holder includes a holder main body configured to hold the reel, a slider that is integrated with the holder main body, and a substantially semicircular tape pressing member having a pressing section that is integrated with the slider and said pressing section presses the tape fed from the reel toward the feeder main body from an upper side.

2. The feeder according to claim 1, wherein the reel holder includes a movement mechanism that movably supports the holder main body, the slider, and the tape pressing member between an upper position and a lower position, and in a case where the holder main body is disposed at the lower position, the tape pressing member presses the tape such that the tape fed from the reel to the feeder main body does not pass through a holder main body presence region where the holder main body is to be present if the holder main body is disposed at the upper position.

3. The feeder according to claim 2, wherein in a case where the holder main body is disposed at the lower position, the tape pressing member presses the tape such that the tape fed from the reel to the feeder main body passes through a slider presence region where the slider is to be present if the holder main body is disposed at the upper position.

4. The feeder according to claim 2, wherein the reel holder is held at the same height regardless of movement of the holder main body, and has a duct through which the tape fed from the reel held by the holder main body toward the feeder main body passes in a case where the holder main body is disposed at the lower position.

5. The feeder according to claim 1, wherein the reel holder is swingably attached to the feeder main body in an axial direction of the reel.

6. The feeder according to claim 5, wherein the reel holder is attached to the feeder main body through support shafts in an up-down direction, and further has a plate spring that sandwiches the feeder main body.

7. A component mounting apparatus for picking up components supplied from multiple feeders set on a feeder setting base with a pickup member and mounting the components on a board, wherein the feeders are the feeders according to claim 1.

8. A feeder comprising: a feeder main body configured to feed a tape in which a component is accommodated to a predetermined position; and a reel holder attached to an upstream side of the feeder main body in a feeding direction of the tape and configured to hold a reel on which the tape is wound, wherein the reel holder includes a holder main body configured to hold the reel, a slider that is integrated with the holder main body, a substantially semicircular tape pressing member having a pressing section that is integrated with the slider and said pressing section presses the tape fed from the reel toward the feeder main body from an upper side, and a movement mechanism that movably supports the holder main body, the slider, and the tape pressing member between an upper position and a lower position.

9. The feeder according to claim 8, wherein in a case where the holder main body is disposed at the lower position, the tape pressing member presses the tape such that the tape fed from the reel to the feeder main body does not pass through a holder main body presence region where the holder main body is to be present if the holder main body is disposed at the upper position.

10. The feeder according to claim 8, wherein in a case where the holder main body is disposed at the lower position, the tape pressing member presses the tape such that the tape fed from the reel to the feeder main body passes through a slider presence region where the slider is to be present if the holder main body is disposed at the upper position.

11. The feeder according to claim 8, wherein the reel holder is held at the same height regardless of movement of the holder main body, and has a duct through which the tape fed from the reel held by the holder main body toward the feeder main body passes in a case where the holder main body is disposed at the lower position.

12. The feeder according to claim 8, wherein the reel holder is swingably attached to the feeder main body in an axial direction of the reel.

13. The feeder according to claim 12, wherein the reel holder is attached to the feeder main body through support shafts in an up-down direction, and further has a plate spring that sandwiches the feeder main body.

14. A component mounting apparatus for picking up components supplied from multiple feeders set on a feeder setting base with a pickup member and mounting the components on a board, wherein the feeders are the feeders according to claim 8.

* * * * *